(12) United States Patent
Lin (10) Patent No.: US 10,609,846 B1
(45) Date of Patent: Mar. 31, 2020

(54) ADAPTER BOARD STRUCTURE FOR POWER MODULE OF DC POWER SUPPLY

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW)

( * ) Notice: Subject to any disclaimer, the term of this patent is extended or adjusted under 35 U.S.C. 154(b) by 0 days.

(21) Appl. No.: 16/363,972

(22) Filed: Mar. 25, 2019

(51) Int. Cl.
| H05K 9/00 | (2006.01) |
| H05K 1/11 | (2006.01) |
| H05K 7/20 | (2006.01) |
| H05K 7/02 | (2006.01) |
| H05K 1/18 | (2006.01) |
| H05K 1/02 | (2006.01) |

(52) U.S. Cl.
CPC ............. *H05K 9/002* (2013.01); *H05K 1/119* (2013.01); *H05K 7/026* (2013.01); *H05K 7/20145* (2013.01); *H05K 1/0216* (2013.01); *H05K 1/181* (2013.01); *H05K 2201/09063* (2013.01); *H05K 2201/09145* (2013.01); *H05K 2201/10189* (2013.01)

(58) Field of Classification Search
CPC .... H05K 9/002; H05K 7/20145; H05K 7/026; H05K 1/119; H05K 2201/10189; H05K 1/181; H05K 2201/09145; H05K 2201/09063; H05K 1/0216; H05K 7/1492

USPC ........ 361/735, 752, 728, 736, 800, 816, 818
See application file for complete search history.

(56) References Cited

U.S. PATENT DOCUMENTS

| 10,008,454 | B1* | 6/2018 | Ho | H01L 23/552 |
| 2002/0051345 | A1* | 5/2002 | Serizawa | H01R 12/616 361/749 |
| 2008/0042617 | A1* | 2/2008 | Gamboa | H01M 10/425 320/107 |
| 2013/0183005 | A1* | 7/2013 | Lu | G02B 6/3887 385/78 |
| 2014/0022737 | A1* | 1/2014 | Hsiao | H05K 7/1432 361/729 |
| 2017/0250010 | A1* | 8/2017 | Jen | H05K 7/1432 |
| 2019/0058415 | A1* | 2/2019 | Sun | H05K 1/0231 |

* cited by examiner

*Primary Examiner* — Daniel P Wicklund
*Assistant Examiner* — Sagar Shrestha
(74) *Attorney, Agent, or Firm* — Sinorica, LLC (57) ABSTRACT

An adapter board structure for a power module of a DC power supply is disclosed. The DC power supply includes a casing. A main circuit control board and at least one power module are disposed in the casing. One side of the power module is provided with a secondary circuit control board. The secondary circuit control board has an input port and an output port for connection of a control wire. Another side of the power module is provided with an adapter board. The adapter board also has an input port and an output port for connection of the control wire. The power module can be electrically connected through the adapter board, and the adapter board has the functions of shielding and wind guiding, thereby isolating noise and electromagnetic interference and improving heat dissipation.

1 Claim, 9 Drawing Sheets

ADAPTER BOARD STRUCTURE FOR POWER MODULE OF DC POWER SUPPLY

FIELD OF THE INVENTION

The present invention relates to a DC power supply, and more particularly to an adapter board structure for a power module of a DC power supply.

BACKGROUND OF THE INVENTION

Figure 1:
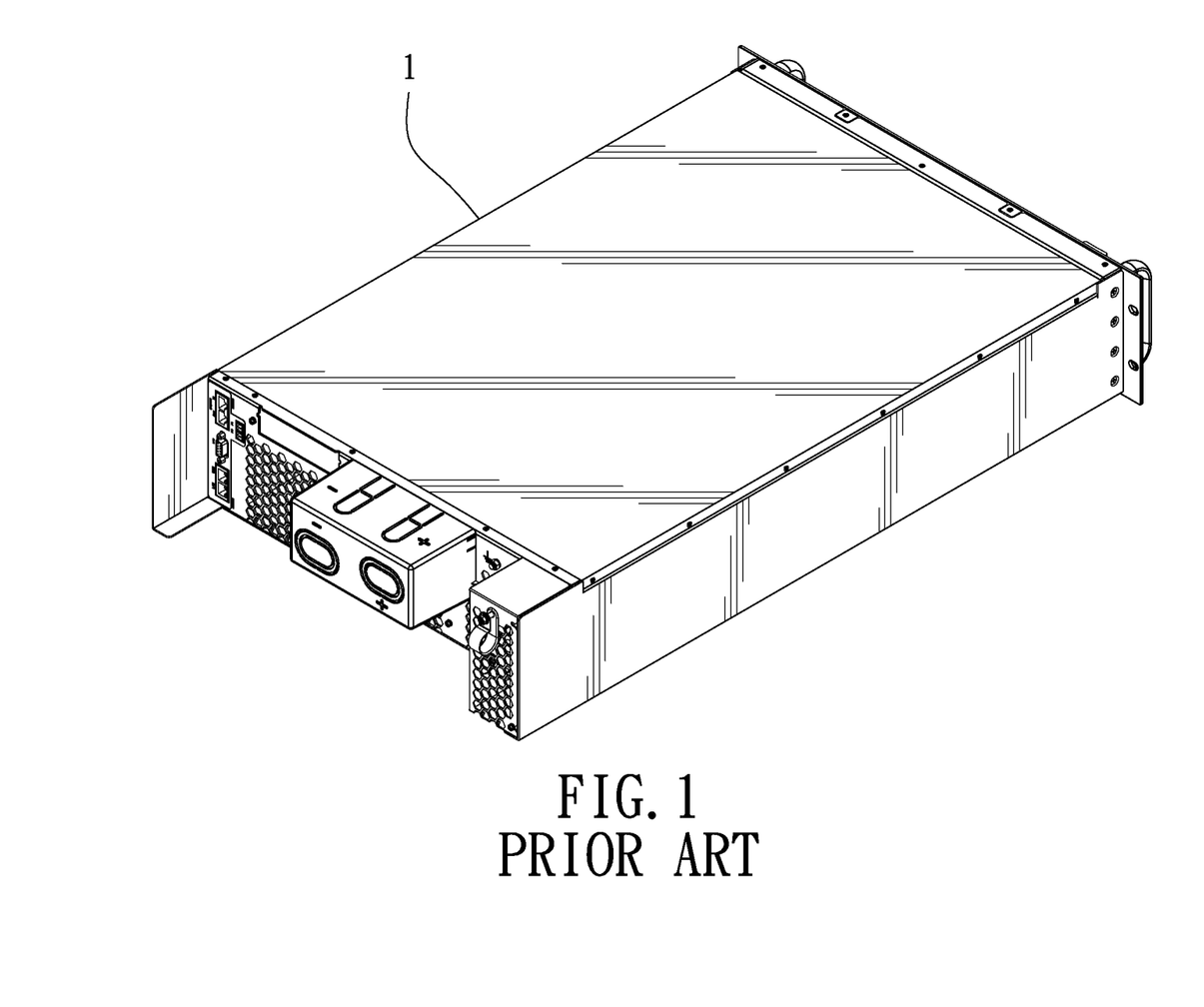
FIG. 1 is a perspective view of a conventional DC power supply.
Figure 2:
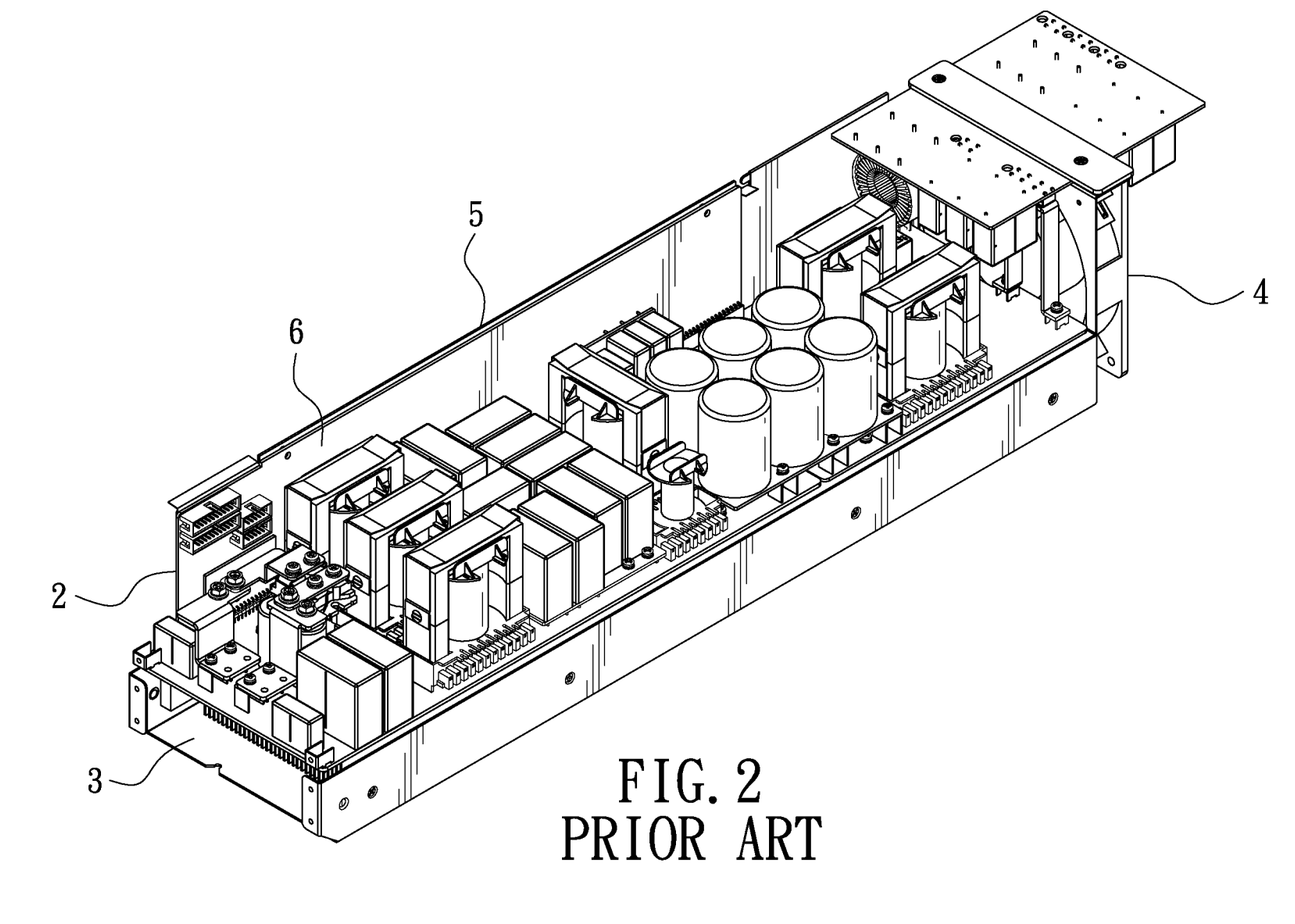
FIG. 2 is a perspective view of the power module of the conventional DC power supply.
Figure 3:
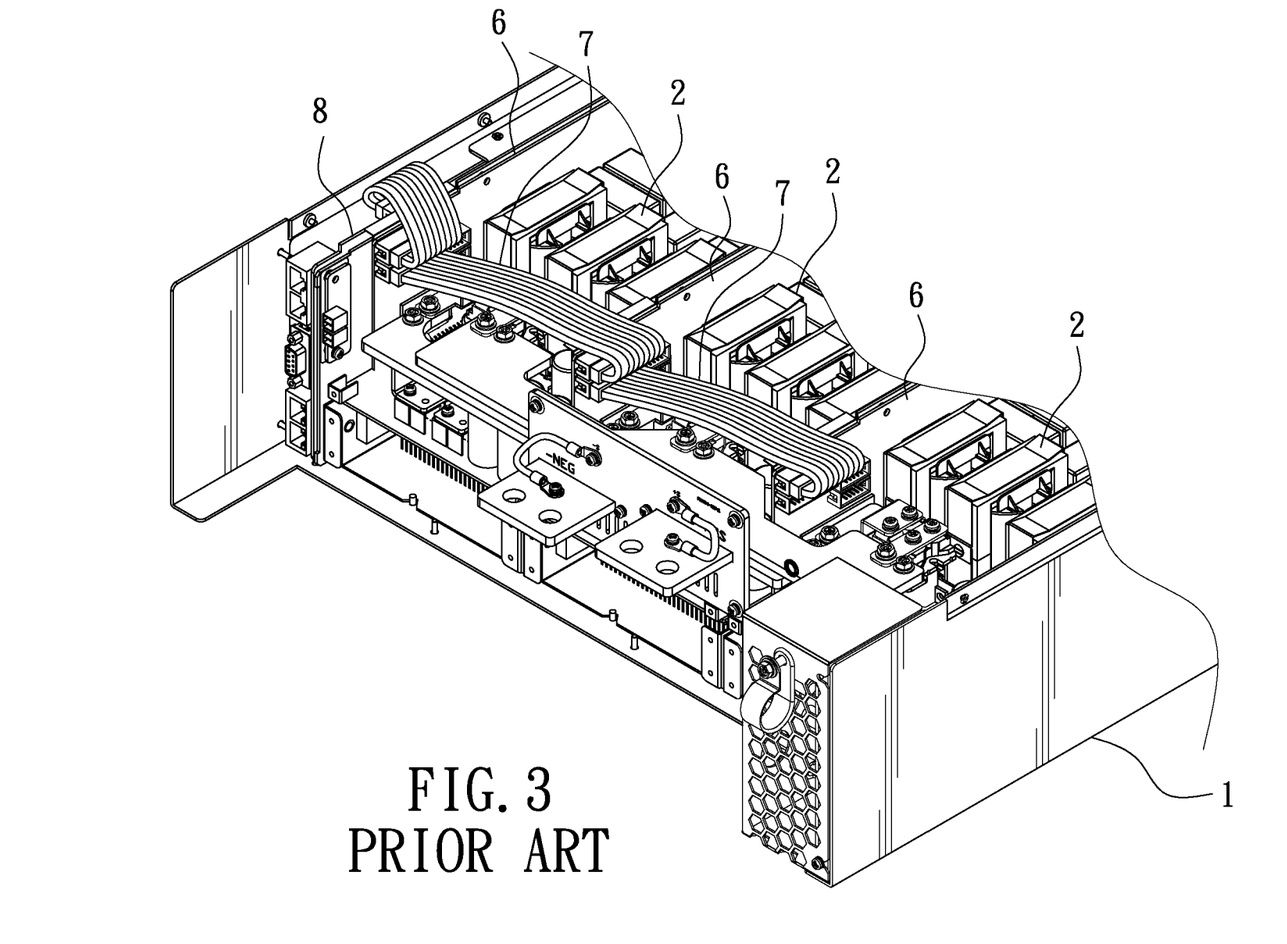
FIG. 3 is a schematic view of the conventional DC power supply with three power modules installed in the casing to form a full load.
Figure 4:
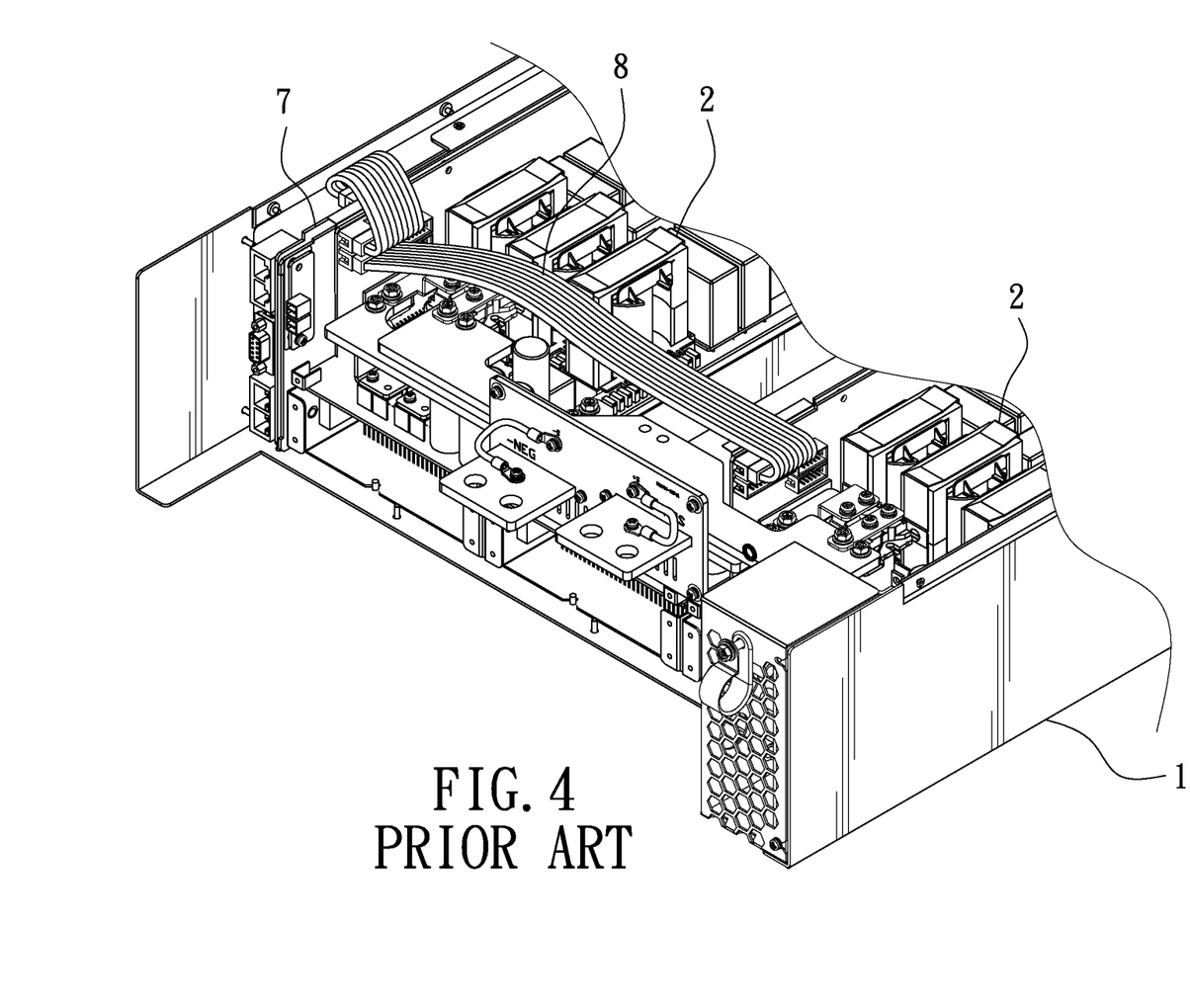
FIG. 4 is a schematic view of the conventional DC power supply with two power modules installed in the casing to form a middle empty space in the casing.

Conventional DC power supplies need different rated output powers to meet customer's demands. However, power supplies with different rated output powers require different models, which is not cost-effective. Referring to FIG. 1, the industry often uses the same casing 1 and a power module 2 with a single output power. As shown in FIG. 2, the bottom of the power module 2 is provided with a base 3. A fan 4 is disposed at the front end of the power module 2. An upright board 5 is longitudinally disposed on one side of the power module 2. A circuit board 6 is fixed on the upright board 5. Depending on the rated output power required by the power supply, the corresponding power modules 2 are installed in the casing 1. As shown in FIG. 3, three power modules 2 are installed in the casing 1. The circuit boards 3 of the power modules 2 are connected in series through control wires 7 each having an equal length, and then connected to a main circuit board 8. The power modules 2 connected in series supply the required rated output power. For example, when the output power of the power module 2 is 5 kw, if the DC power supply is equipped with three power modules 2, the total rated output power is 15 kw. When the rated output power of the DC power supply only needs 5 kw or 10 kw, one power module 2 or two power modules 2 connected in series are installed in the casing 1. Since the internal space of the casing 1 is not fully occupied by the power modules 2, in order to maintain the center of gravity of the casing 1, it is required to adjust the position of the power module 2 installed in the casing 1. Referring to FIG. 4, when only two power modules 2 are installed in the casing 1, the power modules 2 are installed on the left and right sides of the casing 1 to maintain the center of gravity of the casing 1. An empty space is formed between the two power modules 2. The original control wires 7 cannot be connected to each other through the circuit boards 6 of the power modules 2, so that the power modules 2 need to be connected by control wires 9 of different lengths. This causes troubles in wiring, degrades the output quality of the power supply, and brings inconvenience in maintenance. In addition, since one side of one power module 2 is unobstructed due to the middle empty space of the casing 1, the cooling wind sent by the cooling fan of the power module 2 dissipates outward, which affects the heat dissipation effect of the power module Accordingly, the inventor of the present invention has devoted himself based on his many years of practical experiences to solve these problems.

SUMMARY OF THE INVENTION

The primary object of the present invention is to provide an adapter board structure for a power module of a DC power supply. In addition to simplifying the wiring of the power supply, the adapter board structure has a shielding effect for isolating noise and electromagnetic interference and a wind guiding effect for improving heat dissipation of the power module.

In order to achieve the aforesaid object, an adapter board structure for a power module of a DC power supply is provided. The DC power supply comprises a casing. A main circuit control board and at least one power module are disposed in the casing. The main circuit control board has an output port. One side of the power module, adjacent to the main circuit control board, is longitudinally provided with an upright board. The upright board is provided with a secondary circuit control board. The secondary circuit control board has an input port and an output port for connection of a control wire. An adapter board is longitudinally disposed at another side of the power module. The adapter board is sized to cover the side of the power module. The adapter board is provided with an input port and an output port corresponding in position to the secondary circuit control board for connection of the control wire. A copper foil is disposed on the adapter board so that one surface of the adapter board is covered by the copper foil.

The adapter board structure for the power module of the DC power supply provided by the present invention is disposed on one side of the power module through the adapter board, and the adapter board is provided with the input port and the output port for connection of the control line. Thereby, the main circuit control board and the power module can be connected through the adapter board, and can be used as a shield of the power module to isolate noise and electromagnetic interference, and can provide a wind guiding effect for the cooling fan to improve the heat dissipation effect of the power module.

DETAILED DESCRIPTION OF THE PREFERRED EMBODIMENTS

Embodiments of the present invention will now be described, by way of example only, with reference to the accompanying drawings.

Figure 5:
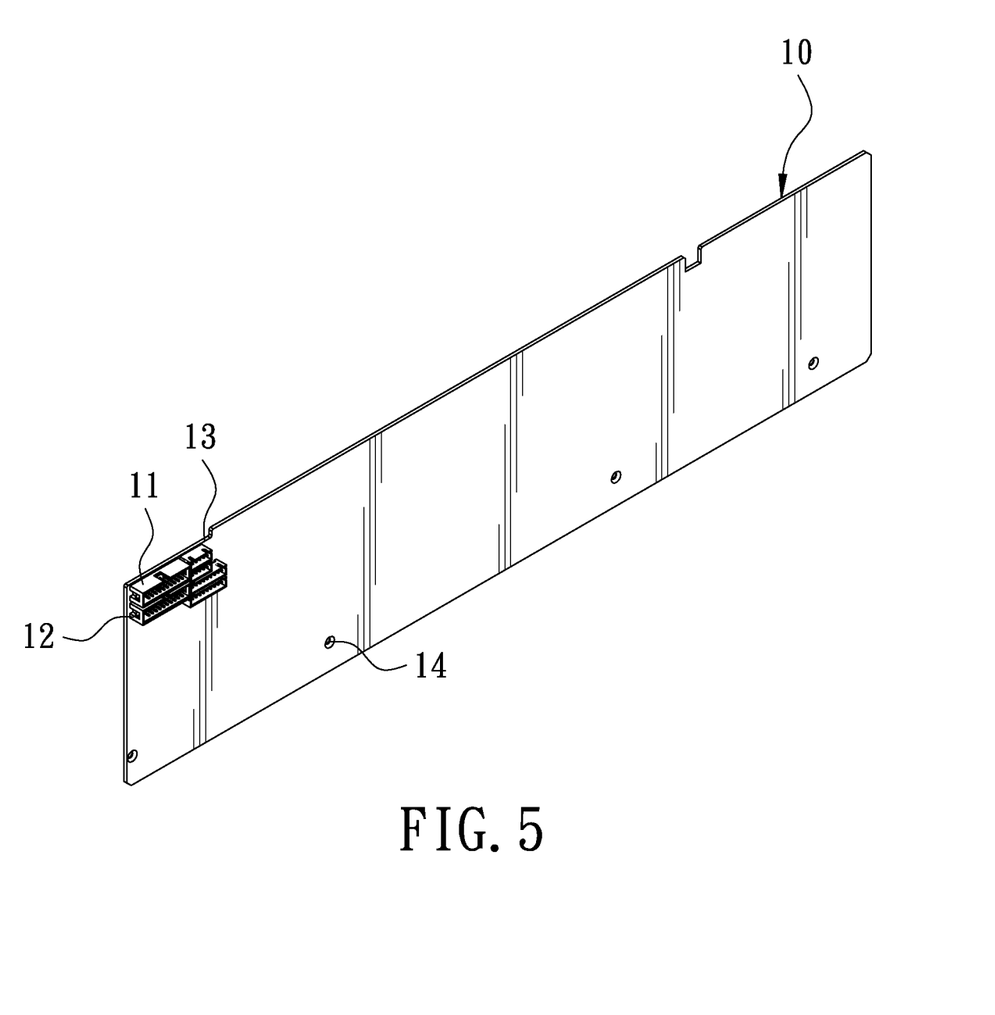
FIG. 5 is a perspective view in accordance with a preferred embodiment of the present invention.
Figure 6:
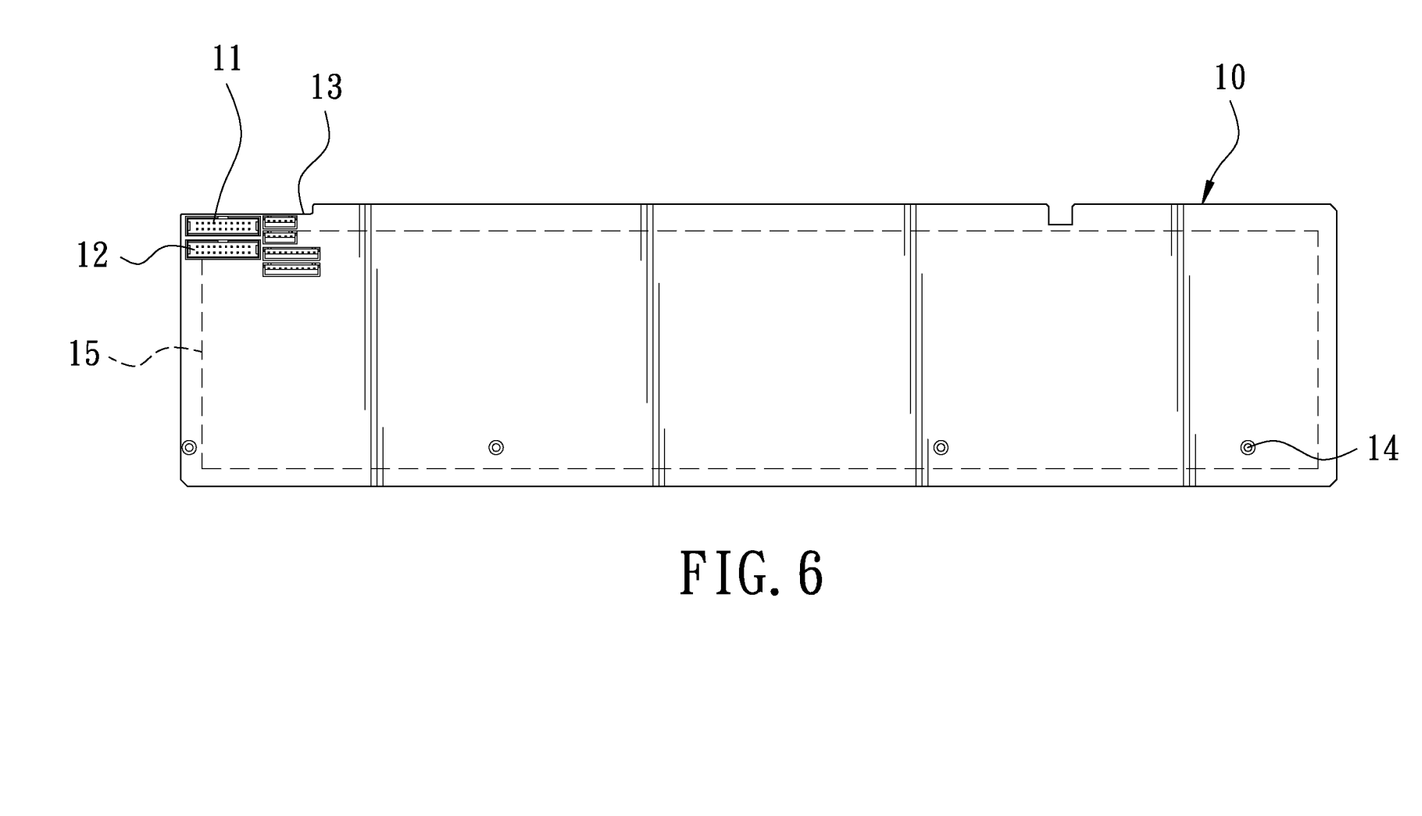
FIG. 6 is a front view in accordance with the preferred embodiment of the present invention.

FIG. 5 is a perspective view in accordance with a preferred embodiment of the present invention. FIG. 6 is a front view in accordance with the preferred embodiment of the present invention. The present invention discloses an adapter board structure for a power module of a DC power supply. The adapter board structure comprises an adapter board 10.

The adapter board 10 is formed by a printed circuit board. The upper portion of the rear end of the adapter board 10 is provided with an input port 11 and an output port 12. The top of the adapter board 10 has a notch 13 corresponding in position to the input port 11 and the output port 12. The lower portion of the adapter board 10 is formed with a plurality of locking holes 14. A copper foil 15 is disposed on the adapter board 10. The copper foil 15 is attached to the back of the adapter board 10, so that the adapter board 10 is covered by the copper foil 15 to form a shield.

Figure 7:
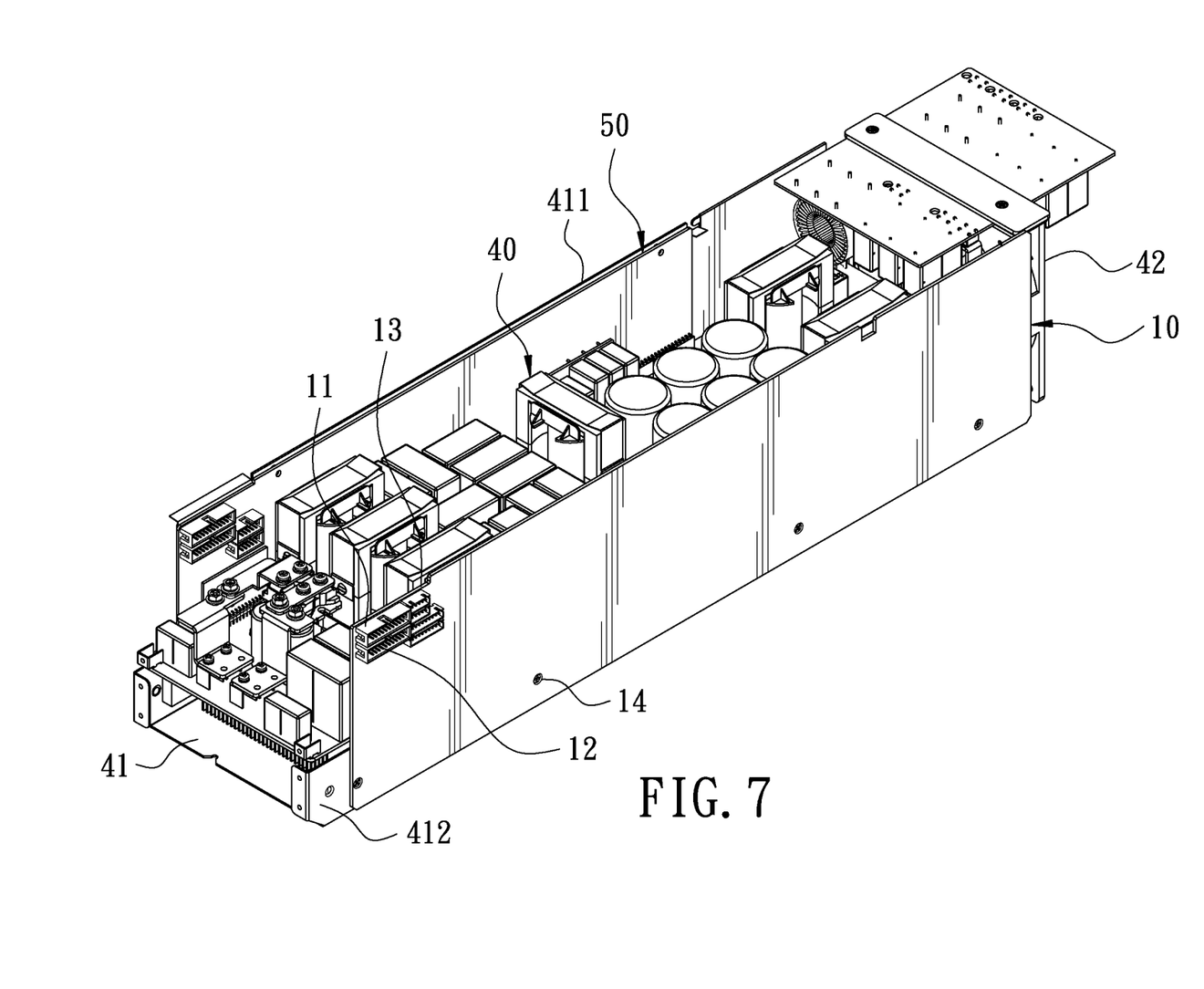
FIG. 7 is a perspective view showing that the adapter board of the present invention is mounted to the power module.

FIG. 7 is a perspective view showing that the adapter board of the present invention is mounted to a power module 40. The power module 40 has a base 41 made of a metal material. One side of the base 41 is provided with an upright board 411 extending longitudinally and made of the same metal material. The upright board 411 is provided with a secondary circuit control board 50. Another side of the base 41 is provided with a locking board 411 extending longitudinally. The adapter board 10 is locked to the locking board 412 through the locking holes 14. The adapter board 10 is sized to cover one side of the power module 40, so that the two sides of the power module 40 can be respectively shielded by the upright board 411 and the adapter board 10 to isolate noise and electromagnetic interference. A cooling fan 42 is disposed in front of the power module 40. The upright board 411 and the adapter board 10 can guide and prevent the cooling wind sent by the cooling fan 42 from dissipating outward so as to be concentrated on the power module 40, achieving a more heat dissipation effect.

Figure 8:
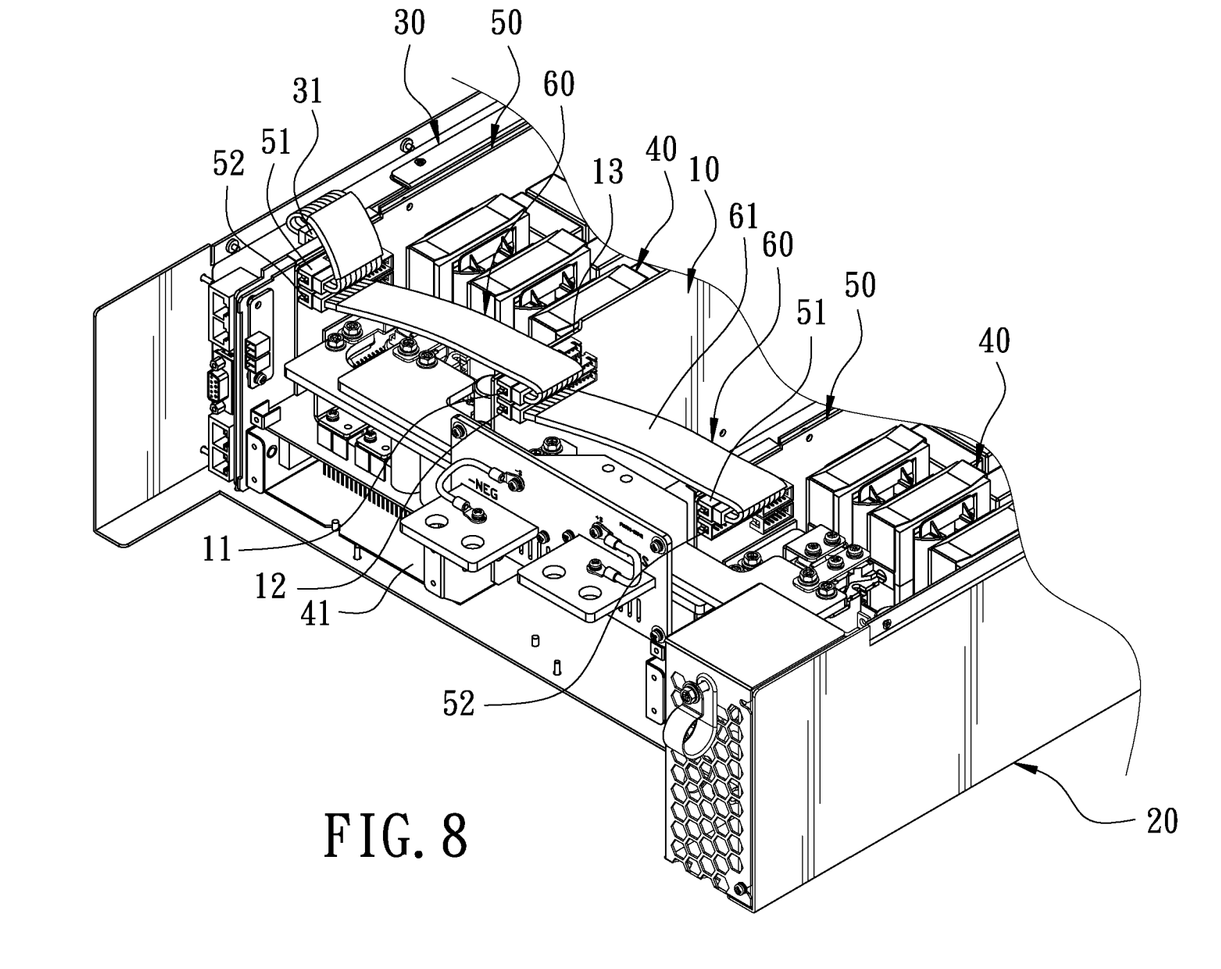
FIG. 8 is a schematic view of the present invention when in use, showing that two power modules are installed in the casing.

FIG. 8 is a schematic view of a first example of the present invention when in use, showing that two power modules 40 are installed in a casing 20. A main circuit control board 30 and two power modules 40 are disposed in the casing 20. The main circuit control board 30 has an output port 31. The power modules 40 are disposed on the left and right sides of the casing 10 respectively, so that the overall weight of the casing 10 is balanced. However, an empty space is formed in the middle of the casing 20. The output port 31 of the main circuit control board 30 is connected with a connecting wire 32. The other end of the connecting wire 32 is inserted into an input port 51 of one secondary circuit control board 50. Then, one end of a control wire 60 is inserted into an output port 52 of the secondary circuit control board 50. The other end of the control wire 60 is inserted into the input port 11 of the adapter board 10 across the notch 13. One end of another control wire 60 is inserted into the output port 12 of the adapter board 10, and the other end is connected to the input sport 51 of another secondary circuit control board 50. Therefore, the main circuit control board 30 can be electrically connected to the power modules 40, so that the main circuit control board 30 can drive the power modules 40. After rectifying the power modules 40 connected in series, the power supply can output the total power of the power modules 40.

Since the distances between the power modules 40 are equal, the length of each control wire 60 is equal. The secondary circuit control boards 50 and the adapter board 10 are connected through the control wires 60 so that the wires in the casing 10 are arranged neatly, which is beneficial for maintenance or replacement. The control wire 60 is a ribbon cable. The outer circumference of the control wire 60 is wrapped with a heat shrinkable sleeve 61 to improve the voltage insulation effect of the control wire 60.

In addition, the upright board 411 and the adapter board 10 are respectively disposed on both sides of the power module 40 to provide a wind guiding effect, so that the cooling wind sent by the cooling fan 42 is confined by the upright board 411 and the adapter board 10, not dissipating outward, to be concentrated on the power module 40 to achieve a more heat dissipation effect.

In addition, since the upright board 411 is made of a metal material and the adapter board 10 is provided with the copper foil mad of a metal material, a safety shield is formed on both sides of the power module 40 to isolate noise and electromagnetic interference.

Figure 9:
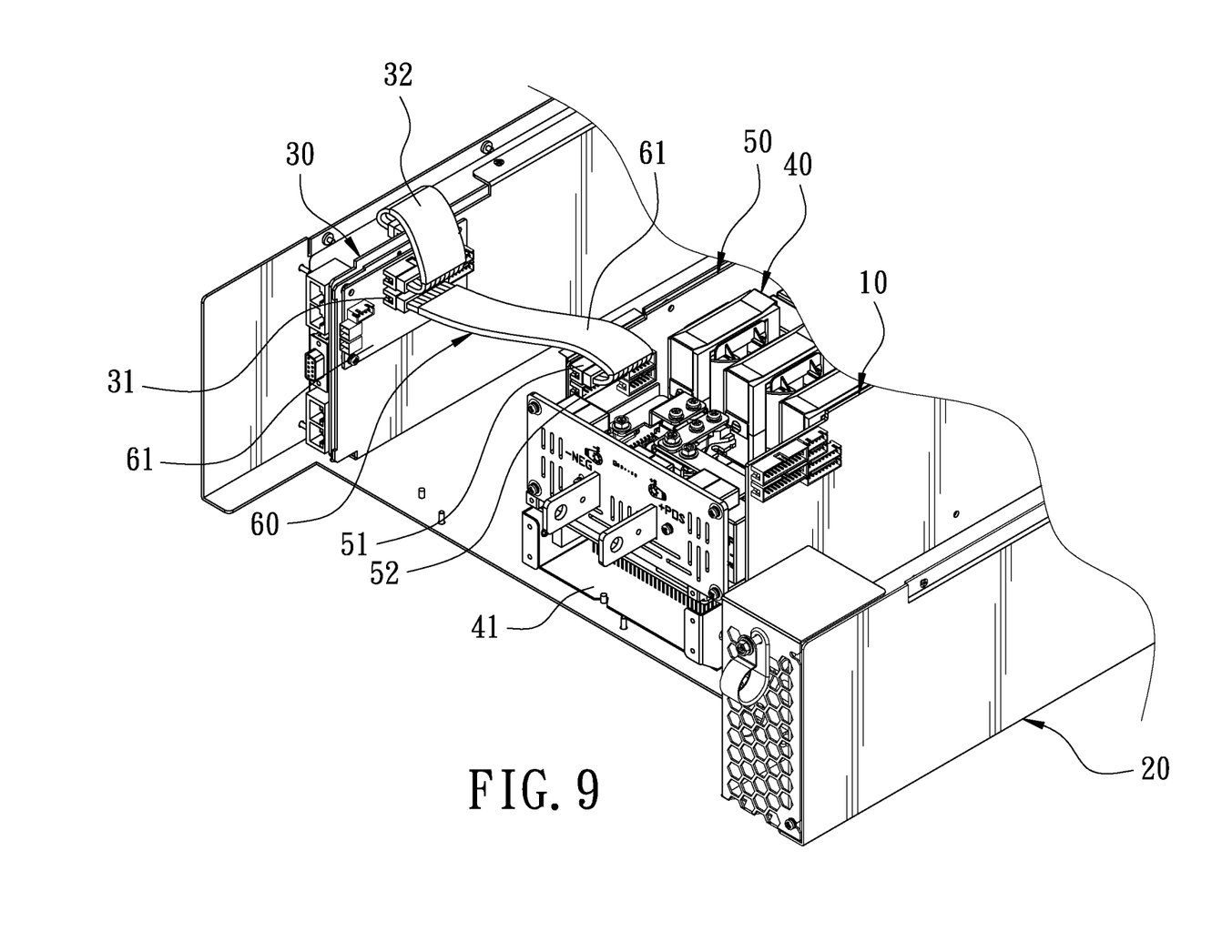
FIG. 9 is a schematic view of the present invention when in use, showing that one power modules is installed in the casing.

FIG. 9 is a schematic view of a second example of the present invention when in use, showing that one power module 40 is installed in the casing 20. The power module 40 is disposed at a middle position of the casing 20 to balance the overall weight of the casing 20. When electrically connected, the power module 40 is connected to the main circuit control board 30 through the control wire 60 to form an electrical connection. The power module 40 also forms a wind guiding and shielding effect by the arrangement of the adapter board 10.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. An adapter board structure for a power module of a DC power supply, the DC power supply comprising a casing, a main circuit control board and at least one power module being disposed in the casing, the main circuit control board having an output port, one side of the power module, adjacent to the main circuit control board, being longitudinally provided with an upright board, the upright board being provided with a secondary circuit control board, the secondary circuit control board having an input port and an output port for connection of a control wire, characterized in that:

an adapter board is longitudinally disposed at another side of the power module, the adapter board is sized to cover the side of the power module, the adapter board is provided with an input port and an output port corresponding in position to the secondary circuit control board for connection of the control wire, and a copper foil is disposed on the adapter board so that one surface of the adapter board is covered by the copper foil;

the adapter board is formed by a printed circuit board;

a top edge of the adapter board has a notch corresponding in position to the input port and the output port of the adapter board so that the control wire can span the notch;

the control wire is a ribbon cable;

the control wire is wrapped with a heat shrinkable sleeve;

the power module has a base;

one side of the base is provided with a locking board extending longitudinally; and the adapter board is locked to the locking board.

* * * * *